(12) United States Patent
Reineck et al.

(10) Patent No.: US 6,261,673 B1
(45) Date of Patent: *Jul. 17, 2001

(54) COATED GROOVING OR PARTING INSERT

(75) Inventors: Ingrid Reineck, Huddinge; Torbjörn Selinder, Stockholm; Anders Piirhonen, Skarpnäck; Gregor Kullander, Älvsjö, all of (SE)

(73) Assignee: Sandvik AB, Sandviken (SE)

( * ) Notice: Subject to any disclaimer, the term of this patent is extended or adjusted under 35 U.S.C. 154(b) by 0 days.

This patent is subject to a terminal disclaimer.

(21) Appl. No.: 09/349,106

(22) Filed: Jul. 8, 1999

(30) Foreign Application Priority Data

Jul. 9, 1998 (SE) .................................................. 9802488

(51) Int. Cl.$^7$ ........................................................ B32B 9/00
(52) U.S. Cl. ........................ 428/216; 57/307; 57/309; 427/255.1; 427/255.2; 427/255.3; 427/355; 427/368; 428/195; 428/323; 428/325; 428/469; 428/472; 428/698; 428/701; 428/702
(58) Field of Search ........................... 428/469, 472, 428/216, 699, 701, 702, 698, 195, 323, 325; 51/307, 309; 427/255.1, 255.3, 255.2, 368, 355

(56) References Cited

U.S. PATENT DOCUMENTS

| | | | |
|---|---|---|---|
| 4,610,931 | * | 9/1986 | Nemeth et al. .................. 75/241 |
| 5,451,469 | * | 9/1995 | Gustafson et al. ............... 428/548 |
| 5,545,490 | * | 8/1996 | Oshika et al. ................... 428/698 |
| 5,549,980 | * | 8/1996 | Ostlund et al. .................. 51/295 |
| 5,652,045 | * | 7/1997 | Nakamura et al. .............. 428/212 |
| 5,674,564 | | 10/1997 | Ljungberg et al. . |
| 5,789,069 | * | 7/1998 | Ljungberg et al. .............. 428/216 |
| 5,915,162 | * | 6/1999 | Uchino et al. ................... 428/698 |
| 5,920,760 | * | 7/1999 | Yoshimura et al. .............. 428/551 |

FOREIGN PATENT DOCUMENTS

| | | |
|---|---|---|
| 0 685 572 | 12/1995 | (EP) . |
| 0 709 484 | 5/1996 | (EP) . |
| WO97/20082 | 6/1997 | (WO) . |
| WO97/20083 | 6/1997 | (WO) . |

* cited by examiner

Primary Examiner—Archene Turner
(74) Attorney, Agent, or Firm—Burns, Doane, Swecker & Mathis, L.L.P.

(57) ABSTRACT

The present invention relates to a coated cutting tool insert useful for grooving or severing steel components such as steel or stainless steel tubes and bars. The insert is characterized by WC—Co-based cemented carbide substrate having a highly W-alloyed Co-binder phase and a relatively thin coating including an inner layer of $TiC_xN_yO_z$ with columnar grains followed by a layer of fine grained $\kappa-Al_2O_3$ and a top layer of TiN.

20 Claims, 1 Drawing Sheet

COATED GROOVING OR PARTING INSERT

FIELD OF THE INVENTION

Figure 1:
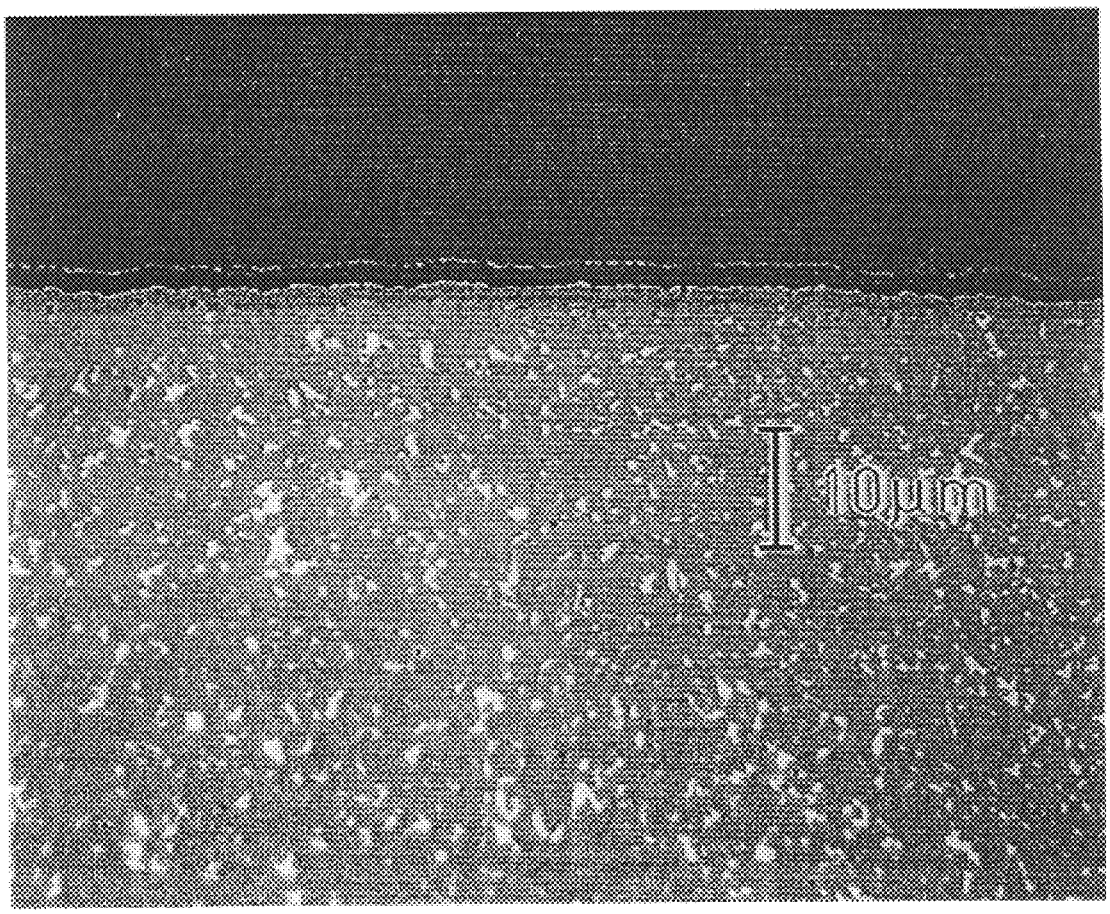

The present invention relates to a coated cemented carbide body. The present invention further relates to a coated cutting tool insert useful for grooving or severing steel components such as steel or stainless steel tubes and bars.

BACKGROUND OF THE INVENTION

When steel or stainless steel tubes or bars are severed using an appropriate coated cutting tool or cutting tool insert, the cutting edge is frictionally heated to a high temperature with the consequence that the material being cut becomes welded onto the cutting edge of the cutting tool insert. As a result, the coating can flake and small cemented carbide chips can be torn out of the cutting tool or cutting tool insert substrate body.

On the other hand, for grooving of the same materials, a high coating wear resistance in combination with a stiff substrate material is required. Finding a cutting tool material that effectively fulfils both these requirements is a challenge.

So far it has been very difficult to improve all tool properties simultaneously. Commercial cemented carbide grades have therefore been optimised with respect to one or few of the wear types and hence to specific application areas.

Swedish patent application 9602413-8 discloses a coated cutting insert particularly suited for wet turning or grooving stainless steel components. The inserts are characterised by a cemented carbide body consisting of WC—Co and cubic carbides coated by one layer of $TiC_xN_yO_z$ with columnar grains, one layer of smooth, fine grained κ—$Al_2O_3$, and preferably an outer layer of TiN.

Swedish patent application 9504304-8 discloses a coated cutting insert particularly useful for wet and dry milling of low and medium alloyed steels. The insert is characterised by a cemented carbide substrate consisting of Co—WC and cubic carbides, a coating including a layer of $TiC_xN_yO_z$ with columnar grains, a layer of smooth, fine grained κ-$Al_2O_3$ and preferably an outer layer of TiN.

SUMMARY OF THE INVENTION

According to the present invention, a combination of the cemented carbide substrates, coatings and insert styles has been developed which gives rise to excellent cutting performance in grooving as well as severing of steel or stainless steel.

According to the principles of the present invention, a cutting tool insert is provided which comprises:
  a cemented carbide body comprising
    6–15 weight % Co, 0.2–1.8 weight % cubic carbides of Ti, Ta and/or Nb, a highly W-alloyed binder phase with a CW-ratio of 0.78–0.93, and the balance WC; and
  a coating comprising
    a first innermost layer of $TiC_xN_yO_z$ wherein x+y+z=1, the first layer having a thickness of 0.1–1.5 μm and equiaxed grains with size<0.5 μm,
    a second layer of $TiC_xN_yO_z$ wherein x+y+z=1, the second layer having a thickness of 0.4–3.9 μm, preferably 1.5–3.0 μm, with coluanar grains with an average diameter of 0.1–5.0 μm,
    a third layer of a smooth fine-grained κ—$Al_2O_3$ layer with a thickness of 0.5–5.5 μm, and
    the total thickness of the first innermost $TiC_xN_yO_z$ and the second $TiC_xN_yO_z$ layer is 0.5–4.0 μm, and the total thickness of all layers is 2.0–6.0 μm, preferably 3.0–5.0 μm.

Further according to the present invention, a method of making a cutting tool insert comprising a WC—Co-based cemented carbide body with a highly W-alloyed binder phase and a CW-ratio of 0.78–0.93, the method comprising coating the body by:
  forming a first innermost layer of $TiC_xN_yO_z$ with a CVD-based technique, wherein x+y+z=1, the first layer having a thickness of 0.1–1.5 μm and equiaxed grains with a size <0.5 μm,
  forming a second layer of $TiC_xN_yO_z$ by a MTCVD-technique, wherein x+y+z=1, the second layer having a thickness of 0.4–3.9 μm and columnar grains with an average diameter of 0.1–5.0 μm,
  forming a third layer of a smooth κ—$Al_2O_3$ having a thickness of 0.5–5.5 μm, and
  forming the layers such that the total thickness of the first and second layers is 0.5–4.0 μm, and the total thickness of all layers is 2.0–6.0 μm.

BRIEF DESCRIPTION OF THE DRAWING FIGURES

FIG. 1 shows in 1800× magnification of a cross section of an insert according to the present invention.

DETAILED DESCRIPTION OF THE PREFERRED EMBODIMENTS

A cutting tool insert according to the invention useful for severing or grooving of steel and stainless steel includes a cemented carbide substrate with a highly W-alloyed binder phase and with a well balanced chemical composition and grain size of the WC, a columnar $TiC_xN_yO_z$-layer which layer thickness should be kept as low as possible, a κ—$Al_2O_3$-layer, a TiNayer and optionally followed by smoothening the cutting edges. For example, the edges may be smoothed by brushing, e.g.—by a SiC-based brush. Surprisingly, beneficial properties have been achieved with a relatively thin coating.

The cobalt binder phase is highly alloyed with W. The content of W in the binder phase can be expressed as the CW-ratio=$M_s$(wt % Co·0.0161), where $M_s$ is the measured saturation magnetisation of the cemented carbide substrate in kA/m and wt % Co is the weight percentage of Co in the cemented carbide. The CW-value is a function of the W content in the Co binder phase. A low CW-value corresponds to a high W-content in the binder phase. According to the present invention improved cutting performance is achieved if the cemented carbide substrate has a CW-ratio of 0.78–0.93.

According to the present invention a parting tool insert is provided with a cemented carbide substrate with a composition of 6–15 wt % Co, preferably 9–12 wt % Co, and most preferably 10–11 wt % Co. The composition further includes 0.2–1.8 wt % cubic carbides, preferably 0.4–1.8 wt % cubic carbides, most preferably 0.5–1.7 wt % cubic carbides, of the metals Ta, Nb and Ti and balance WC. The cemented carbide may also contain other carbides from elements from group IVb, Vb or VIb of the periodic table. The content of Ti is preferably on a level corresponding to a technical impurity. The preferred average grain size of the WC depend on the binder phase content. At a preferred composition of 10–11 wt-% Co, the preferred grain size is 1.5–2.0 μm, most preferably about 1.7 μm. The CW-ratio shall be 0.78–0.93, preferably 0.80–0.91, and most preferably 0.82–0.90. The cemented carbide may contain small amounts, <1 volume %, of ρ-phase ($M_6C$), without any detrimental effect. From the CW-value it follows that no free graphite is allowed in the cemented carbide substrate according to the present embodiment.

The coating comprises a first innermost layer of $TiC_xN_yO_z$ with $x+y+z=1$, preferably $y>x$ and $z<0.2$, most preferably $y>0.8$ and $z=0$, with equiaxed grains with a size $<0.5$ μm, and a total thickness $<1.5$ μm but $>0.1$ μm, preferably the thickness is 0.1–0.6 μm;

a second layer of $TiC_xN_yO_z$ with $x+y+z=1$, preferably with $z=0$, $x>0.3$ and $y>0.3$, most preferably $x>0.5$, with a thickness of 0.4–3.9 μm, preferably the thickness is 1.5–3.0 μm, the second layer has columnar grains with an average diameter of $<5$ μm, preferably 0.1–2.0 μm;

the total thickness of the first and second layers is 0.5–4.0 μm, preferably 1.5–3.5 μm. Preferably, the first layer is thinner than the second layer;

a third layer of a smooth, fine-grained $Al_2O_3$ consisting essentially of the κ-phase having a grain size about 0.5–2 μm. However, the layer may contain small amounts, 1–3 vol-%, of the θ or the α-phases as determined by x-ray diffraction (XRD) measurement. The $Al_2O_3$-layer has a thickness of 0.5–5.5 μm, preferably 0.5–3.0 μm;

preferably, this $Al_2O_3$-layer is followed by a further layer of TiN having a thickness $<1$ μm, preferably 0.1–0.5 μm thick. The $Al_2O_3$ or the TiN layer can be the outermost layer. This outermost layer, whether $Al_2O_3$ or TiN, has a surface roughness $R_{max}<0.4$ μm over a length of 10 μm. The TiN-layer, if present, is preferably removed along the cutting edge by a suitable removal technique, such as brushing; and the total thickness of the first, second and third layers is 2–6 μm, preferably 3–5 μm.

According to a method of the invention, a WC—Co-based cemented carbide substrate is made with a highly W-alloyed binder phase with a CW-ratio of 0.78–0.93, preferably 0.80–0.91, and most preferably 0.82–0.90. The content of cubic carbides of the metals Ta, Nb and Ti is 0.2–1.8 wt %, preferably 0.4–1.8 wt %, and most preferably 0.5–1.7 wt %. The substrate further includes 6–15 wt % Co, preferably 9–12 wt % Co, and most preferably 10–11 wt % Co. The WC grain size is 1.5–2.0 μm, most preferably about 1.7 μm, when the Co content is in the 10–11 wt. % range. The body is coated by:

a first innermost layer of $TiC_xN_yO_z$ with $x+y+z=1$, preferably $y>x$ and $z<0.2$, most preferably $y>0.8$ and $z=0$, with equiaxed grains with size $<0.5$ μm and a total thickness $<1.5$ μm, preferably $>0.1$ μm, preferably 0.1–0.6 μm, using known CVD-methods;

a second layer of $TiC_xN_yO_z$ with $x+y+z=1$, preferably with $z=0$, $x>0.3$ and $y>0.3$, most preferably $x>0.5$, with a thickness of 0.4–3.9 μm, preferably 1.5–3.0 μm, with columnar grains and with an average diameter of about $<5$ μm, preferably 0.1–2.0 μm, is applied preferably using a MTCVD-technique (e.g.—using acetonitrile as the carbon and nitrogen source for forming the layer in the temperature range of 700–900° C.). The exact conditions, however, depend to a certain extent on the design of the equipment used;

the total thickness of the first and second layers is 0.5–4.0 μm, preferably 1.5–3.5 μm. Preferably, the first layer is thinner than the second layer;

a third layer of a smooth, fine-grained $Al_2O_3$ consisting essentially of the κ-phase having a grain size about 0.5–2.0 μm. The $Al_2O_3$-layer has a thickness of 0.5–5.5 μm, preferably 0.5–3.0 μm. Preferably, this $Al_2O_3$-layer is followed by a further layer of TiN having a thickness $<1$ μm, preferably 0.1–0.5 μm thick. The $Al_2O_3$ layer can be exposed as the outermost layer. The outermost layer of $Al_2O_3$ or TiN has a surface roughness $R_{max}<0.4$ μm over a length of 10.0 μm. The smooth coating surface can be obtained by gently wet-blasting the coating surface with fine grained (400–150 mesh) alumina powder, or by brushing (preferably used when TiN top layer is present) the edges with brushes based on SiC as disclosed in Swedish patent application 9402543-4. The TiN-layer, if present, is preferably removed along the cutting edge; and the total thickness of the first, second and third layers is 2.0–6.0 μm, preferably 3.0–5.0 μm.

As a way of further illustrating the present invention and the advantages thereof, the following examples are given.

EXAMPLE 1

A. A cemented carbide cutting tool insert in style N151.2-300-5E with the composition 10.5 wt-% Co, 1.16 wt-% Ta, 0.28 wt-% Nb and balance WC, with a binder phase highly alloyed with W corresponding to a CW-ratio of 0.87, was coated with an innermost 0.5 μm equiaxed $TiC_{0.05}N_{0.95}$-layer with a high nitrogen content, corresponding to an estimated C/N ratio of 0.05, followed by a 2.2 μm thick layer of columnar $TiC_{0.54}N_{0.46}$ deposited using MT-CVD technique. In subsequent steps during the same coating process a 1.5 μm layer of $Al_2O_3$ consisting of pure ic-phase was formed according to procedure disclosed in EP-A-523 021. A thin, 0.5 μm, TiN layer was deposited, during the same cycle, on top of the $Al_2O_3$-layer. Hence, the total thickness of all layers is 4.7 μm. The coated insert was brushed by a SiC containing nylon straw brush after coating, removing the outer TiN layer on the edge.

B. A cemented carbide cutting tool insert in style N151.2-300-SE with the composition of 8.0 wt-% Co, no cubic carbides, balance WC and a CW-ratio of 0.94 was prepared. The insert was coated with an innermost 0.5 μm equiaxed TiCN-layer. A 1.5 μm TiN layer was deposited, during the same cycle, on top of the TiCN-layer. No post treatment was applied.

C. A cemented carbide cutting tool insert in style N151.2-300-SE with the composition of 8.0 wt-% Co, no cubic carbides, balance WC and a CW-ratio of 0.94. The insert was coated with an innermost 0.5 μm equiaxed TiCN-layer with a high nitrogen content, corresponding to an estimated C/N ratio of 0.05, followed by a 4.0 μm thick layer of columnar TiCN deposited using MT-CVD technique. In subsequent steps during the same coating process a 1.0 μm layer of $Al_2O_3$ consisting of pure K phase was formed according to procedure disclosed in EP-A-523-021. A thin, 0.5 μm TiN layer was deposited, during the same cycle, on top of the $Al_2O_3$-layer. The coated insert was brushed by a SiC containing nylon straw brush after coating, removing the outer TiN layer on the edge.

D. A comparative cemented carbide cutting tool insert in style similar to N151.2-300-5E from an external leading cemented carbide producer was selected for comparison. The carbide had a composition of 11.0 wt-% Co, 7.1 wt-% TiC, 12.1 wt-% TaC, 1.3 wt-% NbC, balance WC and a CW-ratio of 0.80. The insert had a coating consisting of 1.1 μm TiN and, outermost, 0.3 μm TiCN layer. Examination in light optical microscope revealed no edge treatment subsequent to coating.

Inserts from A, B and C were compared in a flaking test comprising a facing operation in austenitic stainless steel (SanMac 304L). Feed 0.15 mm/rev, speed 130 m/min and depth of cut varying between 0–2.5 mm.

| Insert | Number of cuts before extensive flaking |
|---|---|
| A (acc. to invention) | 10 |
| B (outside invention) | 5 |
| C (outside invention) | 1 |
| D (external grade) | 1 |

EXAMPLE 2

Inserts A, B, C and D from above were tested in a serving test of stainless steel (SS2343) in the form of 12 mm bar stainless steel.

The rotating speed was 1800 rpm, feed varying 0.15–0.02 mm/rev (low feed rate close to centre of bar).

The wear mechanism was flaking combined with nose cracking.

| Insert | Number of components |
|---|---|
| A (acc. to invent.) | 380 |
| B (outside invention) | 180 |
| C (outside invention) | 200 |
| D (external grade) | 200 |

EXAMPLE 3

Inserts A (insert style N151.2-400-4E) and D were tested at an end users machine shop in severing of a stainless steel tube (SS2343, OD 27 mm, ID 25 rnm) with feed 0.05 mm/rev and speed 150 m/min.

Insert D failed due to major chipping of the cutting edge while a very small chipping was seen on insert A.

| Insert | Number of components |
|---|---|
| A (acc. to invention) | 324 |
| D (external grade) | 108 |

EXAMPLE 4

Inserts A and D were tested at an end users machine shop in parting to centre of an annealed high alloy steel SS2242 with feed 0.15 mmlrev and speed 100 m/min.

Insert D failed due to cracking in the corners while a very small deformation in the corners was seen on insert A.

| Insert | Number of components |
|---|---|
| A (acc. to invention) | 400 |
| D (external grade) | 150 |

EXAMPLE 5

Inserts A (insert style N151.2-400-4E) and D were tested at an end users machine shop in parting of a steel bar (SS2225, OD 50 mm) with feed 0.06–0.14 mm/rev and speed 180 m/min.

Insert D failed due to chipping of the cutting edge while even flank wear was seen on insert A.

| Insert | Number of components |
|---|---|
| A (acc. to invention) | 300 |
| D (external grade) | 150 |

While the present invention has been described by reference to the above-described embodiments, certain modifications and variations will be evident to those of ordinary skill in the art. Therefore, the present invention is to limited only the scope and spirit of the appended claims.

What is claimed is:

1. A cutting tool insert comprising:
    a cemented carbide body comprising
        6–15 weight % Co, 0.2–1.8 weight % cubic carbides of Ti, Ta, Nb or any combination thereof, a highly W-alloyed binder phase with a CW-ratio of 0.78–0.93, and the balance WC; and
    a coating comprising
        a first innermost layer of $TiC_xN_yO_z$ wherein $x+y+z=1$, the first layer having a thickness of 0.1–1.5 $\mu$m and equiaxed grains with size <0.5 $\mu$m,
        a second layer of $TiC_xN_yO_z$ wherein $x+y+z=1$, the second layer having a thickness of 0.4–3.9 $\mu$m, with columnar grains with an average diameter of 0.1–5.0 $\mu$m,
        a third layer of a smooth fine-grained $\kappa$-$Al_2O_3$ layer with a thickness of 0.5–5.5 $\mu$m, and
        a total thickness of the first innermost $TiC_xN_yO_z$ and the second $TiC_xN_yO_z$ layer is 0.5–4.0 $\mu$m, and the total thickness of all layers is 2.0–6.0 $\mu$m.

2. The cutting tool insert of claim 1, wherein the body comprises 9–12 weight % Co and a CW ratio of 0.80–0.91.

3. The cutting tool inset of claim 1, wherein in the first layer $y>x$ and $z<0.2$, and the thickness of the first layer is 0.1–0.6 $\mu$m.

4. The cutting tool insert of claim 1, wherein in the second layer $z=0$, $x>0.3$ and $y>0.3$, the second layer has a thickness of 1.5–3.0 $\mu$m, with the columnar grains having an average diameter of 0.1–2.0 $\mu$m.

5. The cutting tool insert of claim 1, wherein in the third layer the grains of the $\kappa$-$Al_2O_3$ have a size on the order of 0.5–2.0 $\mu$m, and the third layer has a thickness of 0.5–3.0 $\mu$m.

6. The cutting tool insert of claim 1, wherein the total thickness of the first and second layers is 1.5–3.5 $\mu$m.

7. The cutting tool insert of claim 1, wherein the total thickness of all the layers is 3.0–5.0 $\mu$m.

8. The cutting insert of claim 1 further comprising an outermost layer of TiN having a thickness of 0.1–1.0 $\mu$m.

9. The cutting insert of claim 8, wherein the outermost TiN-layer has been removed along the cutting edge.

10. A method of making a cutting tool insert comprising a WC—Co-based cemented carbide body with a highly W-alloyed binder phase and a CW-ratio of 0.78–0.93, the method comprising coating the body by the steps of:
    forming a first innermost layer of $TiC_xN_yO_z$ with a CVD-based technique, wherein $x+y+z=1$, the first layer having a thickness of 0.1–1.5 $\mu$m and equiaxed grains with a size <0.5 $\mu$m,
    forming a second layer of $TiC_xN_yO_z$ by a MTCVD-technique, wherein $x+y+z=1$, the second layer having a thickness of 0.4–3.9 μm and columnar grains with an average diameter of 0.1–5.0 μm, forming a third layer of a smooth κ-$Al_2O_3$ having a thickness of 0.5–5.5 μm, and forming the layers such that the total thickness of the first and second layers is 0.5–4.0 μm, and the total thickness of all layers is 2.0–6.0 μm.

11. The method of claim 10, wherein the step of forming the first layer further comprises providing the first layer with y>x and z<0.2 and a thickness of 0.1–0.6 μm.

12. The method of claim 10 wherein the step of forming the second layer further comprises using acetonitrile as the carbon and nitrogen source and forming the second layer at a temperature of 850–900° C., the step of forming the second layer further comprises providing z=0, x>0.3 and y>0.3, a thickness of 1.5–3.0 μm, and with the columnar grains having an average diameter of 0.1–2.0 μm.

13. The method of claim 10, wherein the third layer is provided with a thickness of 0.5–3.0 μm.

14. The method of claim 10, wherein the method further comprises forming an outer layer of TiN having a thickness of <1 μm.

15. The method of claim 10, wherein the method further comprises providing the first and second layers with a total thickness of 1.5–3.5 μm, and a total thickness of all layers of 3.0–5.0 μm.

16. The method of claim 10 wherein the said cemented carbide body has a cobalt content of 9–12 weight % and 0.4–1.8 weight % cubic carbides of Ta and Nb.

17. The method of claim 10 wherein the cemented carbide body has a cobalt content of 10–11 weight %.

18. The method of claim 17 wherein the cemented carbide body has a CW-ratio of 0.82–0.90.

19. The method of claim 14, wherein the outermost TiN-layer is removed along a cutting edge.

20. The method of claim 19, wherein the outermost TiN-layer is removed by brushing.

* * * * *